United States Patent
Cox

Patent Number: 5,357,621
Date of Patent: Oct. 18, 1994

[54] SERIAL ARCHITECTURE FOR MEMORY MODULE CONTROL

[75] Inventor: Darrell L. Cox, Boise, Id.

[73] Assignee: Hewlett-Packard Company, Palo Alto, Calif.

[21] Appl. No.: 135,361

[22] Filed: Oct. 12, 1993

Related U.S. Application Data

[63] Continuation of Ser. No. 578,699, Sep. 4, 1990, abandoned.

[51] Int. Cl.$^5$ .............. G06F 12/06; G06F 13/00
[52] U.S. Cl. .................. 395/400; 395/425; 364/245.31; 364/246; 364/255.1
[58] Field of Search ................ 395/400, 425

[56] References Cited

U.S. PATENT DOCUMENTS

| | | | |
|---|---|---|---|
| Re. 31,318 | 7/1983 | Kaufman et al. | 395/400 |
| 4,507,730 | 3/1985 | Johnson et al. | 395/425 |
| 4,660,141 | 4/1987 | Ceccon et al. | 395/400 |
| 4,679,167 | 7/1987 | Finnell | 395/400 |
| 4,727,475 | 2/1988 | Kiremidjian | 395/400 |
| 4,744,025 | 5/1988 | Lipcon et al. | 395/425 |
| 4,794,592 | 12/1988 | Caine et al. | 370/85.1 |
| 4,856,091 | 8/1989 | Taska | 455/607 |
| 4,964,038 | 10/1990 | Louis et al. | 395/400 |
| 4,980,850 | 12/1990 | Morgan | 395/400 |
| 5,067,105 | 11/1991 | Borkenhagen et al. | 395/400 |
| 5,129,069 | 7/1992 | Helm et al. | 395/400 |

*Primary Examiner*—Joseph L. Dixon
*Assistant Examiner*—Michael A. Whitfield

[57] ABSTRACT

An expandable memory system including a central memory controller and one or more plug-in memory modules, each memory module having an on-board memory module controller coupled in a serial network architecture which forms a memory command link Each memory module controller is serially linked to the central memory controller. The memory system is automatically configured by the central controller, each memory module in the system is assigned a base address, in turn, to define a contiguous memory space without user intervention or the requirement to physically reset switches. The memory system includes the capability to disable and bypass bad memory modules and reassign memory addresses without leaving useable memory unallocated.

3 Claims, 6 Drawing Sheets

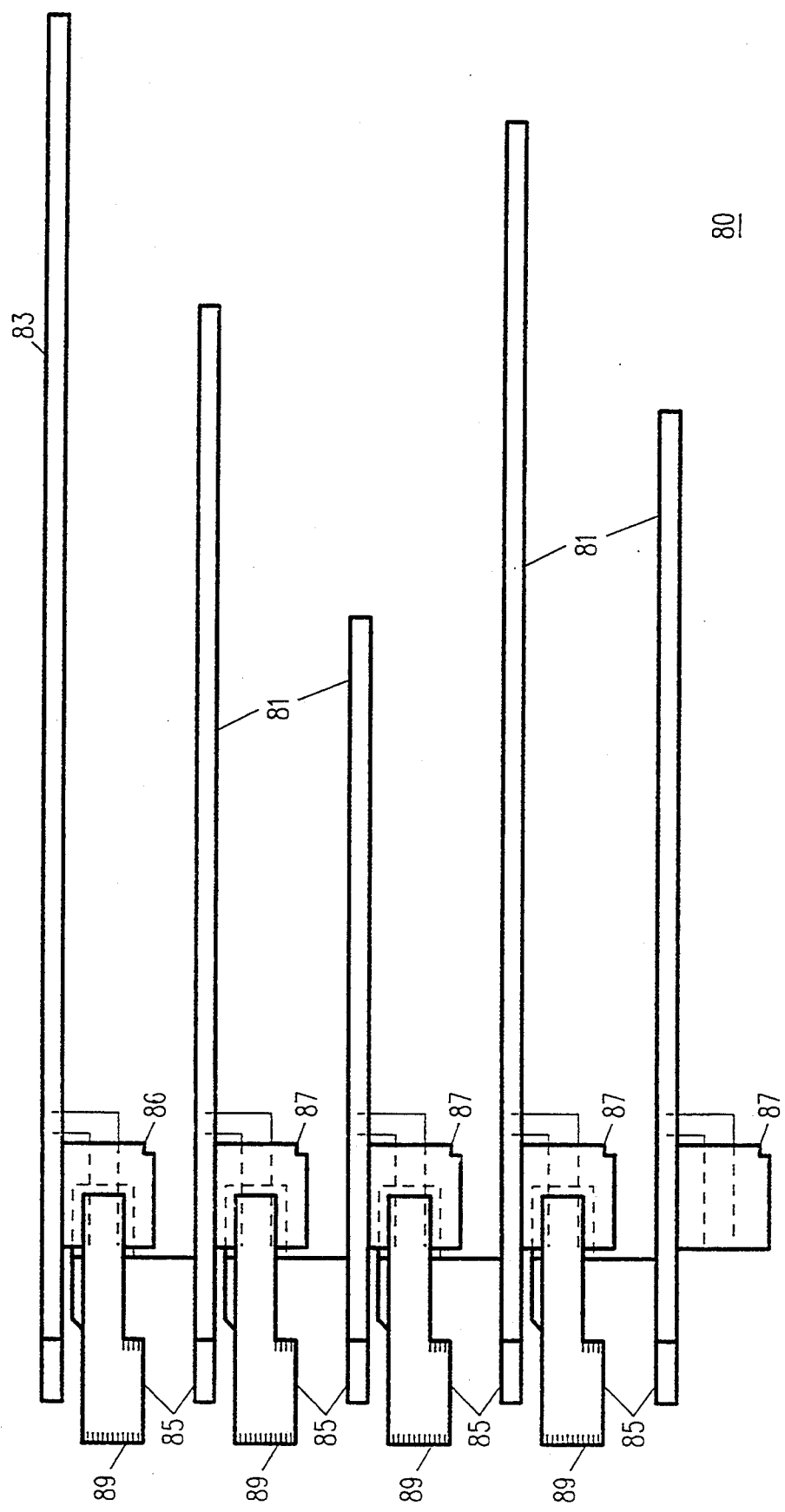

SERIAL ARCHITECTURE FOR MEMORY MODULE CONTROL

CROSS REFERENCE TO RELATED APPLICATION

This is a continuation of copending application Ser. No. 07/578.699 filed on Sep. 4, 1991, now abandoned.

BACKGROUND OF THE INVENTION

The present invention relates generally to memory expandable systems and more particularly, to a serial network architecture for controlling and configuring add-on memory modules.

It is well-known in the prior art to provide modular systems, such as computer peripherals, mini-computers and desktop personal computers, having expandable and flexible memory systems comprised of a plurality of memory modules. Typically, such modules are of the plug-in type in the form of printed circuit boards which have various electronic components mounted upon them, including integrated circuit chips which are also of the plug-in type. The typical design of a modern computer or microprocessor driven device includes a main printed circuit board with one or more female connectors, known as a mother board, to which one or more accessory or option boards including memory modules can be inter-connected. Generally the design features the mother board in a horizontal orientation at the bottom of a computer case with the plug-in memory modules or other accessory printed circuit boards or cards held in vertical slots in the computer case perpendicular to the mother board, and inter-connected to it by means of a mating pair of male and female parallel edge connectors, one of which is attached to the surface of the mother board and the other to the edge of the memory or accessory card.

Typically, a memory module consists of a plug-in printed circuit board which carries an addressable memory unit, memory address and control logic units and local interface units which provides interfacing between the module and the host device. The addressable memory unit will be comprised of one or more blocks or banks of memory cells having a standardized size such as 256 k-bytes. A standardized memory module printed circuit board may have a number of plug in sockets to accept blocks of memory in the form of integrated circuit chips. Thus a standardized plug in printed circuit board may provide memory modules with several different capacities.

In practice, the memory units of the various memory modules are so interconnected as to provide in effect a single addressable memory. The memory unit on each memory module has a starting address and an ending address. The memory modules are interconnected sequentially so that their address ranges are contiguous in order, or sequence, of connection. The starting address of each memory module forming a boundary between that module and any preceding module. Each memory module responds to a range of addresses that includes its starting address and its ending address. Typically, the ending address is determined by adding the memory module capacity to its starting address.

In prior art memory modules, the address range that a particular module will respond to is manually set utilizing toggle or slide switches. If a memory module was replaced with a memory module having a different memory capacity then the switches of all the higher order memory modules must be reset. The requirement for manual setting of address ranges introduces the possibility of human error and is, to say the least, inconvenient.

U.S. Pat. No. RE. 31,318 granted to Kaufman et al on Jul. 19, 1983 discloses a system for automatically setting the address ranges of respective memory modules of a continuous bank of memory modules. A modular mini-computer includes a central processing unit, a number of replaceable memory modules and input and output peripheral devices. Each of the memory modules includes an address range calculator, an address range detector, a local memory unit and memory cell selection logic. The address range calculator of each memory module includes a local memory capacity signal source which provides a signal representative of the capacity of the memory unit of the memory module on which it is mounted. A memory module of one local capacity may be replaced by a memory module of a different local capacity and memory modules of different capacities may be interchanged so long as the total memory capacity remains below the maximum allowable value. Whenever one or more memory modules are installed the ranges of addresses are assigned automatically to the individual modules. A processor module generates a starting address signal for the first installed memory module. The address range for an individual memory module is calculated by adding the local memory unit capacity to the module's starting address to arrive at the module's ending address. The last memory module generates an address signal which represents the upper boundary of the memory system.

SUMMARY OF THE INVENTION

The present invention provides an expandable memory system for use in a computing system which comprises a plurality of plug-in memory modules coupled to a memory system controller in a serial network. The memory system network consists of a central memory system controller and at least one individually addressable memory module controller coupled serially to the memory system controller. Various command signals generated by the memory system controller and information or data signals generated either by the memory system controller or individual memory module controllers in response to commands transmitted from the system controller, are transmitted and received serially between the system controller and the memory module controllers. In the preferred embodiment, up to 7 module controllers and their associated memory modules may be configured in the serial network.

The expandable memory system of the present invention utilizes a plurality of plug-in, add-on memory modules or memory cards wherein each individual memory module comprises a module controller, a module memory address control logic block and at least one memory block having a number of individually addressable memory cells. Each memory module also includes a bi-directional 16-bit data bus, an address bus and an address control bus and primary and secondary module connectors respectively attached to opposite sides of the memory module card. Additional memory may be then added to the expandable memory system by merely plugging in additional memory modules. Upon power up, the memory system controller automatically configures the memory system assigning an address to each of the memory module controllers in the network and a base address for the memory on each of the memory modules in the system.

The serial network architecture utilized provides a memory control link (MCL) system for communications between the memory system controller and each plug-in memory module. The MCL communication is initiated and controlled by the memory system controller and is utilized to interrogate and configure each memory module via its module controller in turn. The memory system controller proceeds through the configuration process each time the system is powered up by first initializing the module controllers and then providing each module controller with its individual address. The interrogation process provides the system controller with the memory capacity of each memory module card installed as well as the type of memory module. During the memory configuration process, the memory system controller assigns a base or starting address to each memory module card in turn and defines the location of a logical address block associated with each memory module installed within the memory system map for the host system. In addition, the memory system controller allows testing of the individual memory module cards, removing or disabling a memory module which tests bad while maintaining the integrity of the remaining memory modules on the MCL system.

The present invention provides an expandable memory system wherein the total capacity of the memory system may be increased or changed by plugging in or removing memory module cards. The memory system controller via the MCL system serial architecture automatically assigns the base address for each memory card and defines the memory block position in the total memory space without user intervention or the requirement to physically reposition toggle or slide switches. The system also includes the capability to bypass or disable bad memory modules and reassign memory addresses without leaving useable memory unallocated. One preferred embodiment of the present invention provides parallel pin connectors attached on both sides of a memory module board to allow the individual memory boards to be installed in piggy back fashion eliminating the need for a mother board having a plurality of connectors, one for each plug-in memory board.

BRIEF DESCRIPTION OF THE DRAWING

A fuller understanding of the present invention, will become apparent from the following detailed description taken in conjunction with the accompanying drawing which forms a part of the specification and in which:

FIG. 6 is a plan view of a plurality of plug-in memory modules mounted on a mother board.

DETAILED DESCRIPTION OF THE PREFERRED EMBODIMENT

Figure 1:
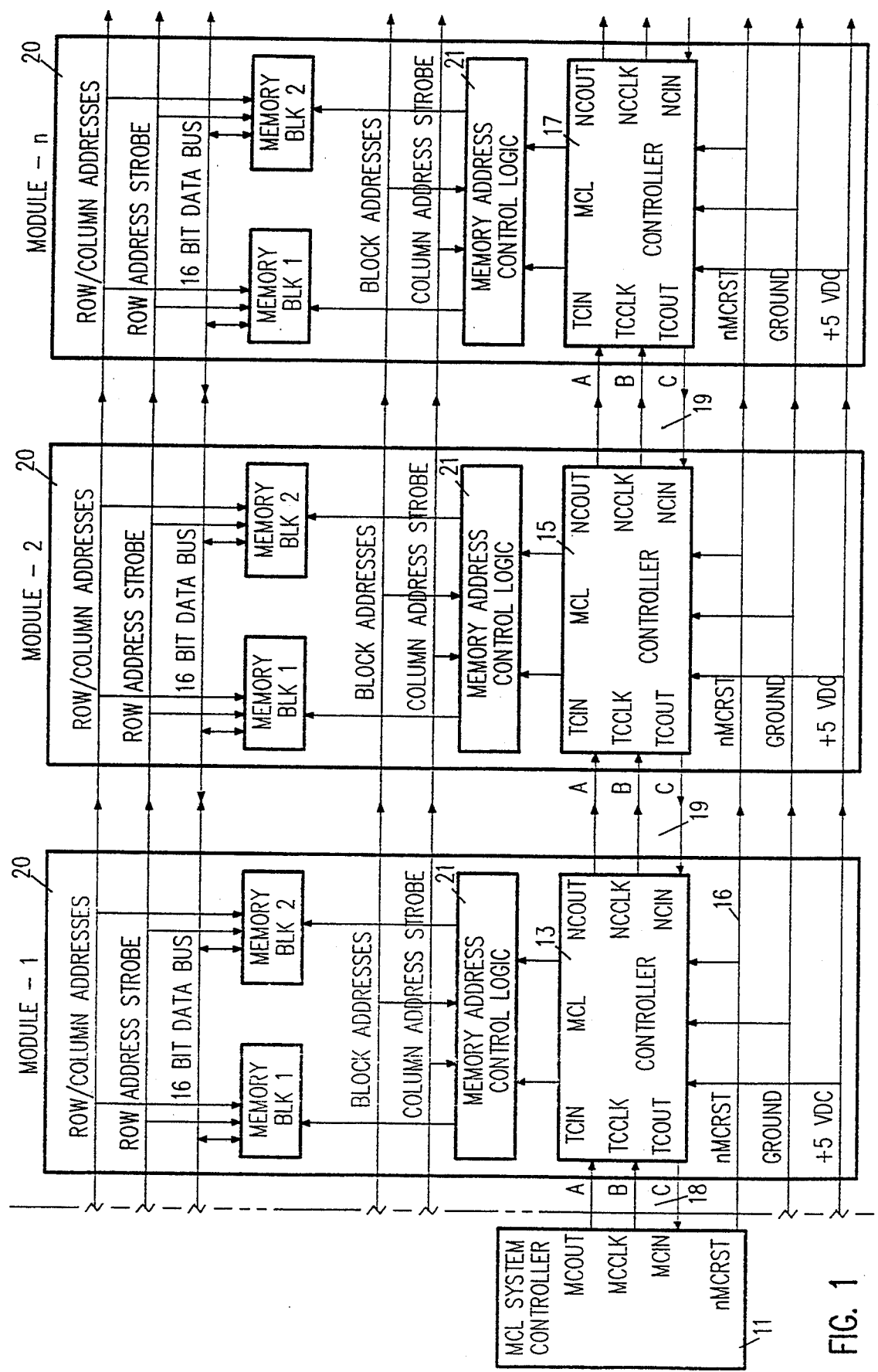
FIG. 1 shows a memory control link system arranged in the serial network architecture in accordance with the preferred embodiment of the present invention.
Figure 2:
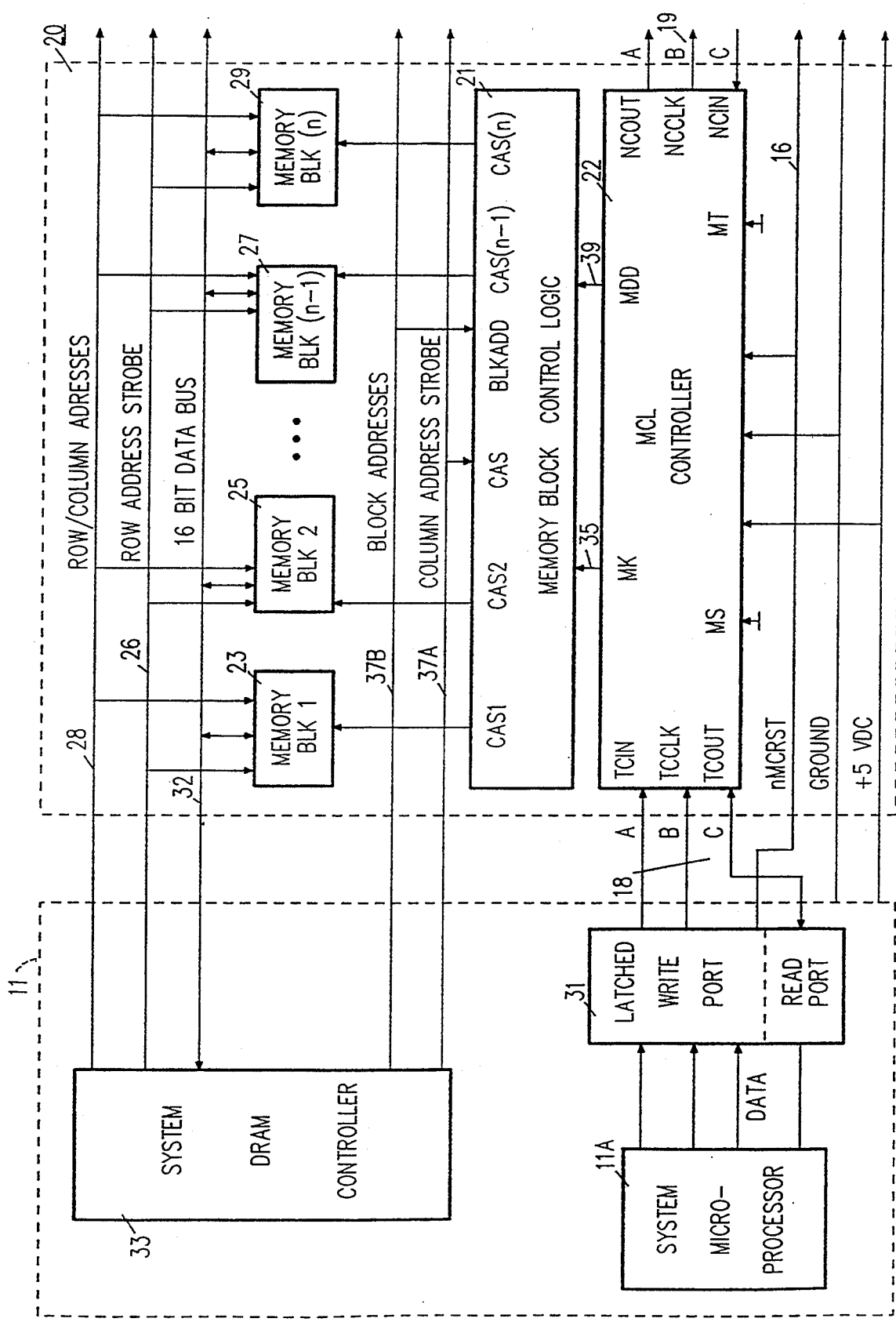
FIG. 2 is a block diagram of a plug-in memory module implemented in the memory control link system shown in FIG. 1.

Referring now to FIGS. 1 and 2, FIG. 1 shows a block diagram of a memory control link (MCL) system arranged in a serial network architecture according to the principles of the present invention. The MCL system comprises a host or system controller 11 and one or more memory module MCL controllers 13, 15, and 17 connected together in serial fashion, the system controller 11 utilizing a three wire serial data bus for communication to and from the link controllers 13, 15 and 17. The present invention utilizes a basic method for communication in a serial network detailed in U.S. Pat. No. 4,794,592 entitled "Serial Network Architecture for User Oriented Devices" issued to Craine et al on Dec. 27, 1988, and is incorporated herein by reference as if set forth in its entirety.

FIG. 2 is a block diagram of an expandable memory system utilizing plug-in add-on memory modules wherein each individual memory module 20 comprises a module MCL controller 22, memory address control logic 21 (programmable array logic blocks) and one or more blocks of memory 23, 25, 27 and 29, each memory block comprising, for example, a 256 k-byte dynamic random access memory (DRAM) array. The memory module 20 also includes a bi-directional 16 bit data bus 32, an address control bus 28, and 2 module connectors (not shown).

While the preferred embodiment is limited to 7 plug-in modules 20 by the particular hardware utilized, any number of plug-in memory modules 20 having their MCL controllers 22 serially linked as shown in FIG. 1 may be utilized to configure an expandable memory system.

The MCL system 10 provides a serial architecture for communicating with each plug-in memory module 20. The MCL controller serial communication is initiated and controlled by the system controller 11 and is utilized to interrogate and configure each memory module 20 via its MCL controller 22 in turn. System microprocessor 11a is an integral part of the system controller 11. The system controller 11 proceeds through the configuration process each time the system is powered up by first initializing the MCL controllers 1 through N, 13, 15, 17, identifying each module 20 and checking the preprogrammed coding. The interrogation process provides the system controller 11 with the number of memory modules 20 installed as well as the type of memory module (features and speed) and memory size (memory capacity). During the memory configuration process, the system controller 11 sets the address range of each memory module 20, in turn, and defines the location of a soft address or logical address block within the memory system map for the host system. The host system 11 provides testing of the memory modules 20 during the configuration process. If a particular memory module 20 tests bad or is malfunctioning, the system controller 11 can logically remove the bad module while maintaining the integrity of the remaining memory modules on the MCL system. The MCL system 10 is used only to interrogate and configure the memory modules 20, and is not used during real time memory accesses by the host system. The system DRAM controller 33 provides the appropriate signals for controlling the individual memory blocks 23, 25, 27, 29 during real time memory accesses by the host system. The DRAM address, data and control signals are independent of the MCL system 10.

Each memory module 20 has 2 MCL interfaces which provide interconnection of multiple memory modules 20 in a daisy chain or serial fashion. The first or primary MCL interface is used for communication with the system controller 11 or the preceding memory module. The secondary MCL interface provides communication with the next succeeding memory module 20 in the memory control link (if present). The system controller 11 can communicate directly only with the first memory module 20 in the chain. System controller messages for memory modules further down the chain are relayed by the intermediate MCL controllers on each memory module 20. The memory configuration process defines where the memory space provided by a particular memory module 20 will reside within the host system memory space. Once the system controller 11 has interrogated the memory module 20 for memory size and type information, the system controller 11 will then specify the starting address for the memory module. Typically, the starting address of a memory module is the starting address of the immediately preceding already defined memory module, plus the size of that memory module thereby providing a contiguous memory space. While the system controller 11 attempts to provide contiguous memory, it is not required that the memory space may be defined with all address blocks assigned. Additional blocks of memory may be defined anywhere within the memory space if desired or necessary. Similarly, undefined blocks or space may be left in the memory space if necessary, for example, to bypass a failed memory block. As discussed above, the starting address of a newly added memory module 20 is calculated by adding the memory size of the preceding memory module to the starting address of that preceding memory module. The process is repeated for each memory module 20 in turn until the entire memory space is defined. The starting addresses that are assigned to each of the individual memory modules 20 are referred to as base addresses. A specific memory module 20 will respond to addresses defined from [BASE] to [BASE+SIZE].

When a memory module 20 has been configured and designated a base address, the 4-bit base address for that memory module is coupled on line 35 to the memory address control logic block 21. Combinational logic is utilized to control memory device selection based on the result of a logical address calculation involving the current physical address on lines 37a and b and the memory module base address. If the physical address falls within the range of [BASE] to [BASE+SIZE] then the memory module is enabled and memory accesses are allowed via the system DRAM controller 33. The logical addresses are the result of a real time substraction of the memory module base address from the current physical address on lines 37a and b provided by the system DRAM controller 33. The calculation of the logical addresses is a signed calculation since a negative result indicates that the current physical address is below the memory module base address and the particular memory module is not being accessed. The size of the accessible DRAM memory provided by the memory module determines the range of logical addresses that will be responded to for that memory module. Each memory module 20 includes subtraction logic and generates the local logical addresses for its on board DRAM.

For example, a 1 megabyte memory module 20 is configured with a base address D00000 (in the preferred embodiment, all addresses are represented by hexadecimal numbers). If the current physical address on lines 37a and b is less than D00000, than the local logical address calculation result is negative and the memory module is not addressed. Current physical address D00000 corresponds to a local logical address of 0 which addresses the first accessible memory location on the memory module. Increasing current physical addresses then will have a one-to-one correspondence to local logical addresses until the memory size of the memory module 20 is reached. When the current physical address exceeds DFFFFF, no memory will be addressed unless a second subsequent memory module is connected and configured at a base address of E00000.

In the preferred embodiment, the most significant address bus bits of the current physical address are coupled via bus 37b to the memory address control logic 21 to be compared to the base address bus 35. The real time logical combination between the physical address on bus 37b and the base address on bus 35 coupled with the DRAM column address strobe on bus 37a via the memory address control logic 21 provides the selection of the appropriate memory block 23, 25, 27 and 29. The least significant address bits of the current physical address are multiples and appear on the row/column address bus 28. The row address strobe (RAS) on line 26 latches the Row address and the column address strobe (CAS) on line 37a latches the column address. While the preferred embodiment is implemented with 4 blocks of 256 k-bit DRAM to provide 1 megabyte of memory on each memory module 20, the number blocks may be increased and the memory address control logic 21 may be extended to provide memory modules having larger total accessible total memory size.

With continuing reference to FIGS. 1 and 2, the MCL controller 22 comprising a microprocessor or microcontroller having 1 KByte-bit of internal ROM, which holds program code in resident firmware which provides the MCL communication capability on 2 groups of I/O pins (a 4-bit microprocessor designated COP421 manufactured by National Semiconductor, Inc. is suitable for this purpose). Additional I/O pins provided on the MCL controller are defined as strappable options that are readable by the system controller 11 to provide memory module memory size and type information. Additional MCL controller 22 I/O lines are utilized to communicate either serially between other serial linked memory modules and to set and return base address and other information concerning the memory module 20.

The primary control signals from the system controller 11 are memory controller out (MCOUT) on line 18a, memory controller clock (MCCLK) on line 18b, memory controller N (MCIN) on line 18c and memory controller reset (nMCRST) on line 16. The MCOUT signal provides serial data to the first MCL controller 13 on the MCL system 10 from the system controller 11. The MCCLK signal provides the clock to synchronize outgoing (MCOUT) and incoming (MCIN) serial data between the system controller 11 and the first MCL controller 13. The reset signal is a common signal that will hardware reset all of the MCL controllers 13, 15, 17 on the MCL system 10 when the reset signal is set to logical 0. The system controller 11 signal descriptions are listed in TABLE VI. The system controller 11 output lines 18a, 18b and 16 are latched at block 31 and input line 18c is read through block 31.

The MCL system controller 11 control signal lines will be assigned to the memory module 20 MCL controller control lines in the following manner: nMCRST=nMCRST; MCOUT=TCIN; MCCLK=TCCLK; and MCIN=TCOUT. The MCL controller 22 control signal descriptions are listed in TABLE VI.

Figure 3:
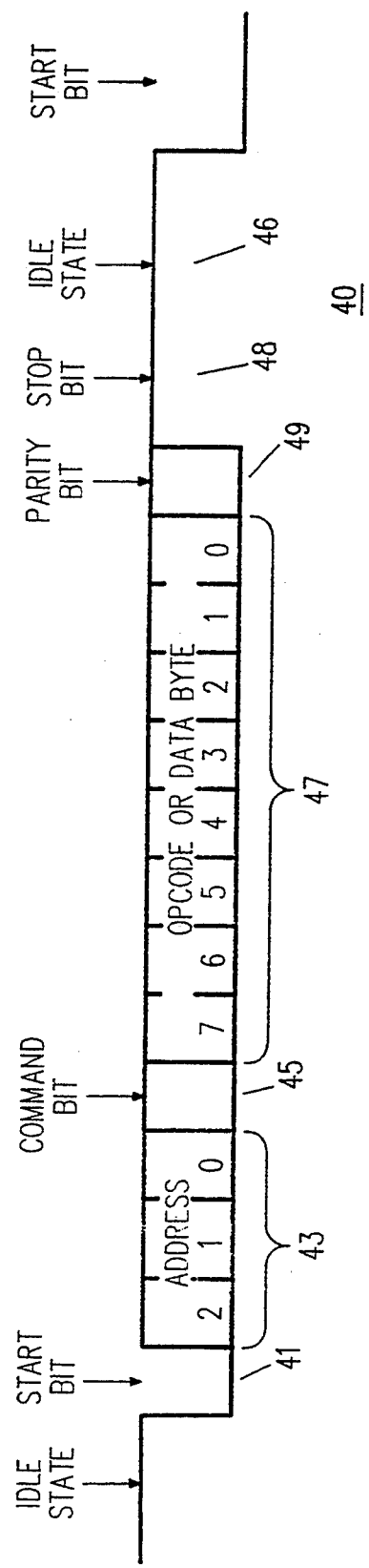
FIG. 3 illustrates a 16-bit data frame format utilized with the memory control link system shown in FIG. 1.

Referring now also to FIG. 3, a diagram illustrating the memory control link information frame format is shown. The MCL information frame 40 comprises 15 bits of information being with a signal bit start bit 41, 3 address bits 43, a command bit 45, 8 data bits 47, a parity bit 49 and a stop bit 48. The frame start bit is always a logic 0 while the frame stop bit is a logic 1. The parity bit is computed so that the total number of logic one bits in the 15-bit frame (including the start, address, command, data, parity stop bits) is odd. The most significant bit of the frame is the start bit 41, followed by the address bit A2-A0, followed by the command bit 45 followed by data bits D7-D0, followed by the parity bit and then the stop bit.

The system controller 11 initiates all command transfers and waits for the individual MCL controllers response. Each MCL controller on the control link is responsible for passing through a command and echoing back the returning command or data to the system controller 11. Each MCL controller 22 passing commands will provide the clock to send the command and receive the response to the command. The system controller 11 can freely clock the information frame 40. To prevent the possibility of the system controller 11 being interrupted during an information frame transfer, a minimum time for transmitting a subsequent information frame after receiving a previous information frame response is imposed on the system controller 11. Since the information frame clocking from MCL controller to MCL controller is independent of the system controller 11 transfer rate, the delay time imposed upon the system controller 11 prior to transmitting a subsequent information frame must be long enough to insure that the previously sent information frame has been received by the addressed memory module device 20 and all responses have been received back by the system controller 11.

The data bits D7-D0, 47, may contain a command or operation code (Opcode) or other data such as a response by a memory module 20 to a command sent by the system controller 11. Communication originates with the system controller 11 by transmitting an information frame containing 1 command at a time. The address bits 43 indicate which of the memory modules 20 on the memory command link that the information frame is being sent to. Each MCL controller 22 on the memory command link is responsible for passing the frame down the link to the appropriate memory module and returning the command or response to the system controller 11. When a command is being sent in the information frame 40, the command bit 45 must be set. Address 0 is the universal address and every memory module 20 on the memory command link will respond to this address.

Table 1 is a summary of each command and includes the command Opcode (in the preferred embodiment, all Opcodes are in hexadecimal numbers). The data return column in Table 1 indicates whether or not extra data bytes will be returned in response to the transmitted command. A yes indicates one or more data bytes will be returned prior to the initiating command returning. A no indicates only the command will be returning. The number next to the yes indicates the number of bytes being returned. The system controller 11 examines each returned frame 40 checking the command bit 45. If the command bit is set during an expected non-command data transfer, then the system controller 11 will assume a transmission error and reissue the initiating command or terminate MCL controller activity. The individual MCL controllers 22 on the memory link will not check for transmission errors on the return path from other MCL controllers.

TABLE 1

| Command Opcode | Device Address | Data Returned | Command Description |
|---|---|---|---|
| 00 | Universal | No | Interface Clear |
| 01 | Universal | No | Device Soft Reset |
| 02-07 | Universal | — | Reserved |
| 08-0F | Universal | No | Address Configure |
| 10 | Specific | No | Enter Pass-Thru Mode |
| 11-1F | Specific | — | Reserved |
| 20 | Specific | No | Enter Loop-Back Mode |
| 21-2F | Specific | — | Reserved |
| 30 | Specific | No | Memory Type |
| 31-3F | Specific | — | Reserved |
| 40-4F | Specific | No | Write Memory Address Task |
| 50-5F | Specific | No | Write Disable/Shadow Size |
| 60 | Specific | Yes 256 | Read Program Code |
| 61-6F | Specific | — | Reserved |
| 70 | Specific | Yes 1 | Memory Configuration Status |
| 71 | Specific | Yes 1 | Read L-Part Status |
| 72-9F | Specific | — | Reserved |
| A0 | Specific | No | Controller Status |
| A1-AF | Specific | — | Reserved |
| B0-EF | Specific | — | Reserved |
| F0 | Universal | No | Configuration Error |
| F1 | Specific | No | Transmission Error |
| F2-FF | — | — | Reserved |

Interface Clear (Opcode 00) is used to clear the power-up mode or to clear an error-condition resulting from a configuration or a transmission error or a prohibited Opcode detected by an individual MCL controller 22. The primary function of the Interface Clear command is to clear the power up mode in the MCL controllers and to verify the integrity of the control link as configured. Interface Clear is transmitted with a universal address. No configuration information is effected by Interface Clear. Upon receiving the Interface Clear command, each MCL controller 22 will clear the power up mode and then retransmit the command as received. Interface Clear command, each MCL controller 22 will clear the power up mode and then retransmit the command as received.

The Soft Reset (Opcode 01) instructs an MCL controller 22 to reset to the pass through mode and retransmit the command down the link, then place itself back into the loop back mode and enter the power up mode. The result is that all MCL controllers 22 on the control link will receive this command, but the command will not be returned to the system controller 11 since the last MCL controller 22 on the control link will enter the pass through mode and transmit the command frame "off the end" of the serial control link. After the system controller 11 has transmitted the Soft Reset command, it must delay for an adequate time to ensure propagation of the command through the control link. Once the Soft Reset command is propagated through the control link, the control link configuration will be in its power up state with all MCL controllers in the loop back mode and all range addresses cleared and disabled.

The Address Configure command (Opcode 08–0F) is utilized to assign unique match addresses to each MCL controller 20 on the control link and is always sent with the universal address. Although the Address Configure command is specified as a range of commands, the first Address Configure command transmitted is the Opcode 09. The MCL controllers interpret the lower 3 bits of the Opcode as the match address of the receiving MCL controller. The MCL controller will increment these 3 bits by 1 then retransmit the modified command. Thus, the first MCL controller receiving Opcode 09 assumes match address 1, then retransmits the command with Opcode 0A. The second MCL controller will receive Opcode 0A, match address 2 and retransmit Opcode 0B, and so on. In the preferred embodiment, since the number of MCL controllers on a control link is limited to 7, when a device receives Opcode 0F it accepts match address 7 as expected but retransmits Opcode 08, consistent with the definition of only incrementing the lower 3 bits of the Opcode. An MCL controller receiving Opcode 08 leaves its match address unchanged then transmits the Configuration Error Opcode. The Address Configure command may also be used to determine the number of memory modules configured on the control link. The system controller 11 transmits the Opcode 09 and waits for the returning command from the last MCL controller on the control link. Each MCL controller configured on the control link will increment the Opcode 09 by 1. By subtracting the Opcode 09 from the returned Opcode, the system controller can determine the number of memory modules on the control link, except when the number of memory modules on the control link is 7. In this case the returned Opcode for the 7th memory module is Opcode 08.

The Pass-Thru Mode command (Opcode 10) instructs the addressed MCL controller to set itself to the pass-through mode which examines and passes all transmitted flames onto the next MCL controller on the control link. When used during the configuration process, the Pass-thru Mode command allows the system controller 11 to sequentially open up the control link to additional MCL controllers until the last MCL controller on the control link is determined. The Pass-Thru Mode command is always sent with a MCL controller specific address.

The Loop Back Mode command (Opcode 20) instructs the addressed MCL controller to set itself to the loop back mode, which effectively terminates the control link and then retransmits the command back to the system controller 11. When used during the configuration process, the Loop Back Mode command must be assigned to the last MCL controller on the control link while all others are in the pass through mode. The Loop Back Mode command is always transmitted with an MCL controller specific address.

The Read Memory Type command (Opcode 30) is transmitted with an MCL controller specific address and returns memory type information for the addressed memory module to the system controller 11. The Opcode 30 command will be returned to the system controller 11 with an increased value corresponding to the memory type of the addressed memory module. For example, a returned command of 31 would be a type 1 board.

The Memory Address Mask command (Opcode 40–4F) is utilized to assign the base address for the first memory module on the control link. The mask value corresponds to the upper 4 bits of actual addresses in a 16 megabyte memory system where a 1-megabyte block of memory equals 1 mask value. The mask command values range from 40 to 4F. The 0 to F hexadecimal values define the absolute starting block address in increments of 1 megabyte per block. If more than 1 megabyte of memory exists on a given memory module, the MCL controller 22 will sequentially build additional addressing for each additional block of 1 megabyte of memory. For example, if the system controller 11 defines a block of memory at address C00000, then the mask value will be C, and the memory address mask command will be Opcode 4C. To assign a mask value for the next memory module on the control link, the system controller 11 determines the memory size or capacity of the present memory module and then adds the number of memory blocks to the present memory module's memory address mask and assigns the resulting mask value to the next successive memory module memory address mask. If the present memory module's memory size is 2 megabytes, i.e., 2 memory blocks, the next successive memory module's Memory Address Mask Opcode will be 4E. Each MCL controller 22 is capable of controlling 1 to 8 memory blocks in a memory module 20. The system controller 11 properly assigns the MCL controller with the appropriate memory address mask values without assigning the same mask value to more than 1 memory module unless the proper memory disable control has been utilized. The memory address mask value consists of 4 bits which appear on line 35 and corresponds to the 4 bits representing the most significant bits of the physical address generated by the DRAM controller 33 (as shown in FIG. 2) on bus 37b.

The Write Disable/Shadow Size command (Opcode 50–5F) comprises a two part command. The variant part of the Opcode is the 4-bit nibble 0 to F. This nibble is composed of a memory module disable bit and 3 memory size bits. When the most significant bit of the nibble is set to one, the entire memory for the specified memory module is disabled. When the most significant bit is set to 0 (low) the entire memory of the memory module is enabled. The memory module disable bit is coupled on line 39 to the memory address control logic 21. The memory device disable bit is a dedicated output bit having no other uses; however, the lower 3 bits of the nibble provide input memory size information in response to another command (Opcode 71). Therefore, the memory size data must be read first then written back in the same form it was read with the disable bit set or cleared as required. For example, if the memory size value was 0 and the memory was to be enabled, then the Opcode would be 50. If the same memory was to be disabled, then the Opcode would be 58. The memory size value will be explained in greater detail in connection with Opcode 71 hereinbelow.

The Read Program Code command (Opcode 60) instructs the addressed MCL controller to return a portion of the MCL controller program code, 256 bytes for the preferred embodiment, to the system controller 11 to be compared to the program code stored by the system controller 11. The program code test comprises a process of reading a portion of the MCL controller processor code to determine if the correct and current code is present. If the correct code is not present, the addressed MCL controller and memory module may be disabled. The program code test is performed separately for each MCL controller on the memory command link and is independent of the memory address configuration process. The program code test may be performed at any time, either prior to or after the memory space has been configured.

The Memory Configuration Status command (Opcode 70) returns the status of a previously written Memory Address Mask command and Write Disable/Shadow Size command. The Memory Configuration Status command functions by transmitting an 8 bit status frame which instructs the addressed MCL controller to return the original command frame. The memory configuration status is stored and registered internal to the MCL controller that is updated after the Read L-Port command, or the Write Memory Address Mask command or the Write Disable/Shadow Size command. The Read L-Port command (Opcode 71) disables the output drivers at the L-Port and writes the data to the memory configuration status register described above. When this port is read, only the 3 memory size data bits (described above) can be regarded as valid input data. Prior to receiving Opcode 71, the specifically addressed MCL controller 22 must be in the loop back mode. As in the case of a Memory Configuration Status command, the system controller 11 expects to receive two frames in response to the Read L-Port Status command, the memory configuration status and the Opcode 7 frames. The logic levels on the memory size bits provide memory size identification. The memory size bit values range from 0 to 7 as defined in Table 2 below.

TABLE I

| Size Bits 210 | Memory Size Definition |
| --- | --- |
| 000 | 1 MByte |
| 001 | 2 MByte |
| 010 | 3 MByte |
| 011 | 4 MByte |
| 100 | 5 MByte |
| 101 | 6 MByte |
| 110 | 7 MByte |
| 111 | 8 MByte |

The Controller Status command (Opcode A0) is transmitted by the system controller 11 to determine the status of the specifically addressed MCL controller. To indicate the status of the addressed MCL controller, the lower 4-bit nibble of the Controller Status command will be modified by the addressed MCL controller as shown in Table III. These 4-bits represent the current mode or state of the addressed MCL controller.

TABLE III

| Data Bit | Opcode A0 Definition |
| --- | --- |
| 0 | LoopBack/Pass Thru Mode 1 |
| 1 | Read Flag |
| 2 | Power Up Mode—Clear |
| 3 | L-Port Read |

Bit 0 indicates Loop Back or Pass Thru Mode. When this bit is a logical 1, the MCL controller is in the Pass Thru Mode. This bit is a logical 0 at Power Up or when in the LoopBack Mode. Bit-1 is the Read Program Code flag. This bit is a logical 1 when the proper program code has been read. Bit-2 indicates the state of the Power Up Mode. When bit-2 is logical 1, the MCL controller has received an interface clear command. Bit-2 is logical 0 at Power Up. Bit-3 is logical 0 at Power Up. When the L-Port has been read, Bit-3 is set to logical 1.

The Configuration Error command (Opcode F0) is returned to the system controller 11 when too many memory modules are attached in the control link at any one time (in the preferred embodiment, more than 7) and it is impossible to assign a unique address to all of the memory modules. The command is returned with the address of the attempted memory module.

The Transmission Error command (Opcode F1) will be returned to the system controller 11 with the address of an MCL controller detecting a parity error or an improper command. Proper response by the system controller 11 to the Transmission Error command is to issue an interface clear with a universal address, check the retransmitted command response to insure the integrity of the control link and then continue. The system controller 11 is responsible for checking the occurrence of transmission errors. The individual MCL controller will not check commands or data returning back to the system controller 11 on the control link.

Figure 4A:
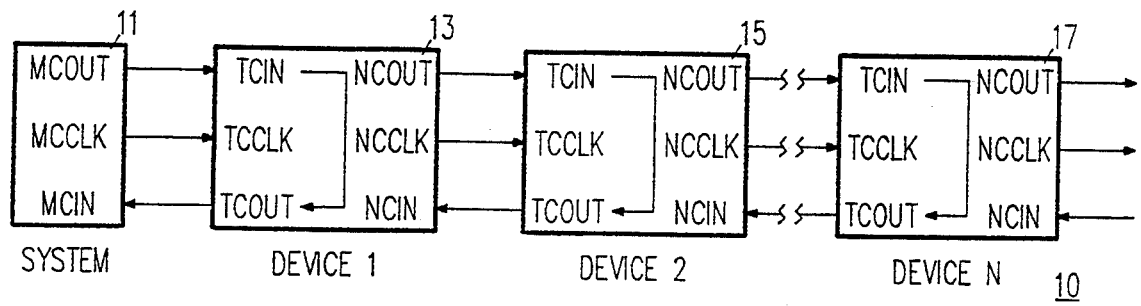
FIGS. 4a, 4b, and 4c illustrate the configuration of the memory control link system shown in FIG. 1 at various stages following power up.
Figure 4B:
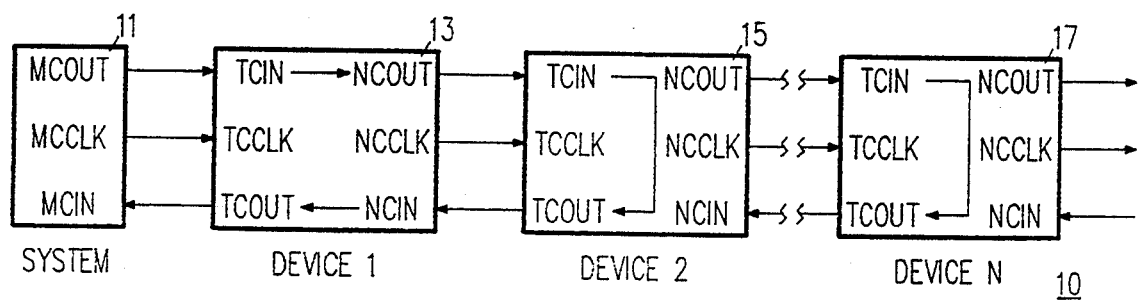

Referring now also to FIGS. 4a-4c and FIG. 5, the MCL controller configuration is shown. As shown in FIG. 4a, following Power Up, hardware reset or a Device Soft Reset command, all MCL controllers 13, 15, 17 on the control link 10 are in the same basic configuration, with the match or range address reset to 0, Power Up Mode set, and each MCL controller set to LoopBack Mode. The goal of the control link configuration process is to assign a unique match address to each MCL controller on the control link 10. When completely configured, all but the last MCL controller 17 will be configured in the Pass Thru Mode.

Figure 4C:
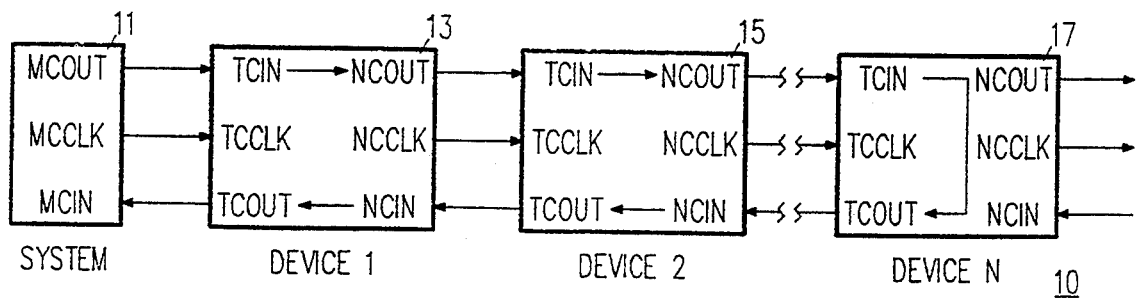
Figure 5:
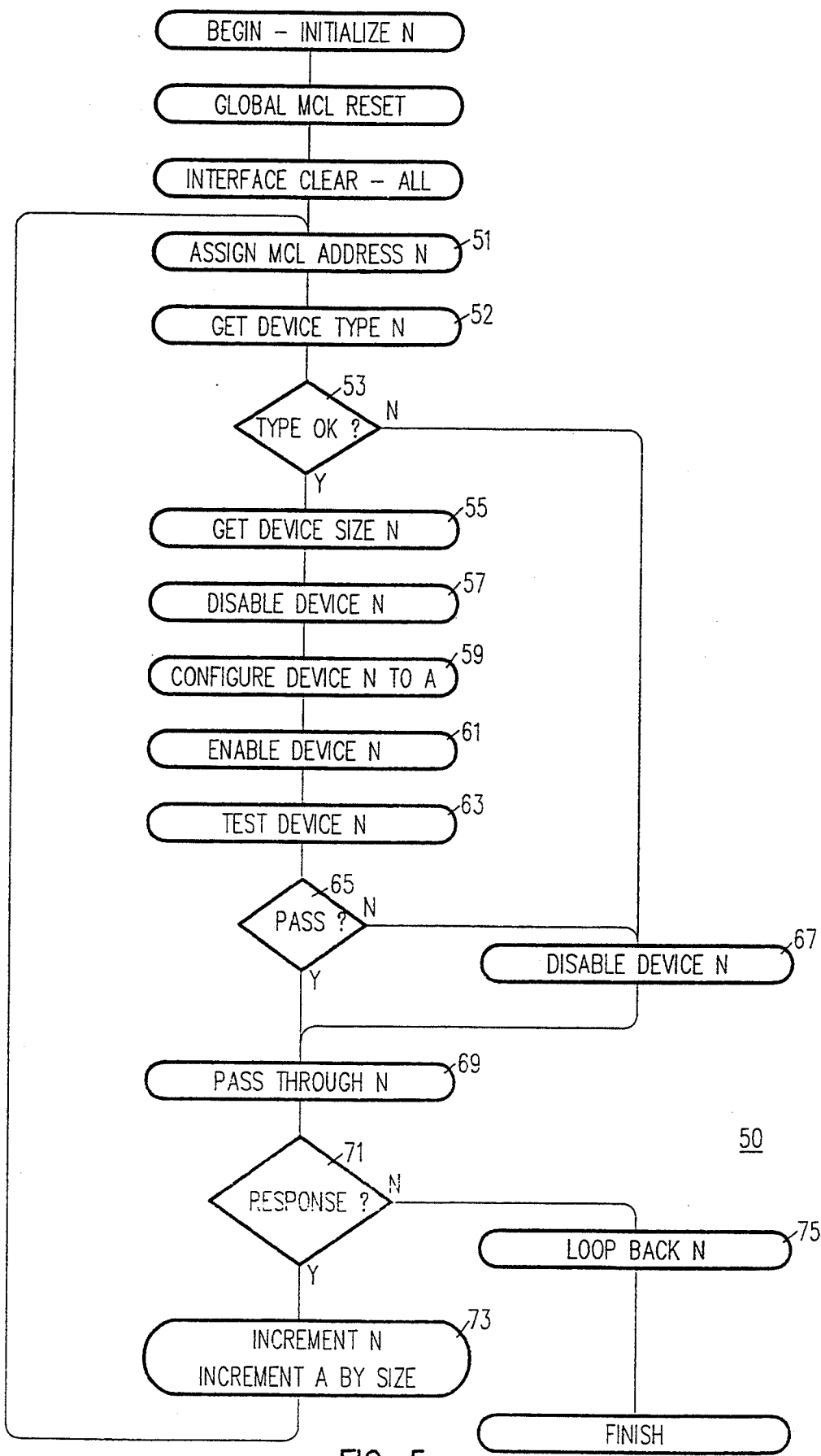
FIG. 5 is a flow chart illustrating the configuration process following power up for the memory control link system shown in FIG. 1.

The first command transmitted by the system controller 11 is Interface Clear, transmitted with a universal address. The first MCL controller 13 receiving the command clears Power Up Mode, then retransmits the command back to the system controller 11. Next the system controller 11 transmits the Address Configuration command, again with a universal address. The Address Configuration command assigns a match address of 1 to the first MCL controller 13 which then returns the Address Configuration command incremented by 1 (Opcode 0A). The system controller 11 may optionally at this time establish the complete configuration of the first MCL controller 13 and memory module 20 by also assigning and configuring the memory addresses (as shown in FIG. 5). Next the system controller 11 transmits the Pass Thru command address to the first MCL controller 13. The first MCL controller 13 then switches to pass through mode and passes on the Pass-Thru command to the next successive MCL controller 15 which returns the command via the first MCL controller 13 to the system controller 11. Since the Pass-Thru command was returned to the system controller, it indicates to the system controller 11 that additional MCL controllers exist on the control link beyond the first MCL controller 13. The configuration of the control link is now shown in FIG. 4b. The above process is then repeated. The system controller 11 transmits a interface clear command with the universal address to the first MCL controller 13. The Interface Clear command has no effect on the first MCL controller 13 which passes the command to the second MCL controller 15. The second MCL controller executes the interface clear by clearing the Power UP Mode and returning the command to the system controller 11. The system controller 11 follows with the Address Configure command (Opcode 0A). The nonconfigured second MCL controller 15 receives the Address Configure command and establishes match address 2, then increments the Opcode by 1, and returns Opcode 0B to the system controller 11. Next the system controller 11 transmits the Pass Thru command addressed to the second MCL controller 15. The second MCL controller 15 then switches to the pass through mode and retransmits the command to the next successive MCL controller. The process is repeated a sufficient number of times to achieve the control link configuration 10 as shown in FIG. 4c. The process continues, configuring n devices on the control link 10 until the Pass Thru command to a specific MCL controller is not returned, indicating that no additional MCL controllers are attached to the control link 10. Next the system controller 11 transmits the LoopBack command to the last addressed MCL controller 17, the MCL controller 17 switches to the loopback mode and returns the command to the system controller 11. The control link 10 is now terminated as shown in FIG. 4c and each MCL controller is assigned a unique match address.

In the above-described configuration process, each MCL controller on the control link 10 was assigned an MCL or match address. The MCL controller addresses are utilized to distinguish between individual MCL controllers. To complete the configuration of the memory system, the memory addresses must be defined for the memory space. FIG. 5 is a flow chart illustrating the memory address configuration whereby the beginning address for the first block of memory on each memory module 20 is defined. The first MCL controller 13 on the control link 10 does not have to be associated with the first available memory address for the memory system. The memory addresses can be defined at the same time that the control link is being configured or, once all of the MCL controllers on the control link 10 have been initialized, the memory addresses can be assigned at a later time in any order desired. The first steps 51, 69, 73, 75 assigned the individual MCL controller addresses and configure the control link 10 as described above. The system controller 11 then transmits Opcode 30 addressed to a specific MCL controller to check the memory module type 52, 53. If the address memory module is not of a memory type which is consistent with the memory system, then the system controller transmits Opcode 5X setting the disabled bit-67 to remove the inconsistent memory module from the memory system. If the addressed memory module is of a consistent type, then the system controller 11 transmits Opcode 71 to interrogate the memory module for the memory size 55. As described above, the L-Port is a bi-directional shared I/O port where the memory size data is input data and the memory address mask bits and the memory module disabled bits are output data bits. Thus, to properly configure the memory, the Write Disabled/Shadow Size command, Opcode 5X, must have the memory size data as read by Opcode 71 in step 55 and memory module disable bit must be set (memory disabled) at this time. The Opcode 5X is transmitted to disable, 57, the memory module prior to transmitting the Write Memory Address Mask command Opcode 4X to configure the memory module base address 59. Once the memory module base address is set, Opcode 5X is again transmitted to enable, 61, the module memory. A test program may now be run, 63, to test the memory module for proper operation. The addressed memory module is now completely configured and the system controller 11 will repeat the process for the next successive memory module 20.

Referring now to FIG. 6, the components for each of the memory modules 20, as shown in FIG. 2, are mounted on separate circuit boards or cards forming removable or plug-in memory expansion boards 81, each board having a predetermined amount of memory on it; e.g., 1 MByte. Each of the plug-in memory boards includes a primary connector 85 on one surface for connecting the plug-in board to a system or formatter board 83 or to another memory expansion board 81. On its opposite surface, each plug-in memory expansion board 81 has a secondary connector to allow additional memory expansion boards to be connected. The apparatus envisions the use of a formatter or system mother board 83 to which is attached on one surface a male parallel pin connector assembly 87 having a plurality of male pins held in parallel orientation one to the other within the connector housing 87 and all parallel to the surface of the mother board 83. The male pins are organized into at least two and typically three separate buses, the first to provide electrical power to a plurality of plug-in memory expansion board assemblies 81 and address bus and a data bus. Each of the memory expansion boards 81 includes an attached female connector assembly 85 on one surface and a male connector assembly 87 on the opposite surface. The connector assemblies 85, 87 are disposed so as to allow interconnection of a plurality of memory expansion cards 81 as shown in FIG. 6, mechanically one to the other with the first of said plurality of memory expansion cards attached to the mother board 83. Ejector levers 89 are attached to the ends of the female connector housing 85 by means of cantilevered bridge assemblies formed on each side of the female connector. Ejector levers 89 facilitate removal or disconnection of an expansion card 81 without placing undue stress on the connector pins and the attached memory card. The pin designation for the primary female connector 85 are shown in TABLE IV. The secondary male connector pin designations are shown in TABLE V. Descriptions of the major system signals for both the primary and secondary connectors for the memory expansion cards are listed in TABLE VI.

TABLE IV

Memory Card Primary Connector Pinout

| Connector Pin # | Signal Name |
|---|---|
| 1 | +5V |
| 2 | +5V |
| 3 | GND |
| 4 | GND |
| 5 | nMCRST |
| 6 | TCIN |
| 7 | nRRD |
| 8 | nBUWE |
| 9 | nBRAS |
| 10 | GND(nA22L) |
| 11 | nA20L |
| 12 | MA8 |
| 13 | MA6 |
| 14 | MA4 |
| 15 | MA2 |
| 16 | MA0 |
| 17 | D14 |
| 18 | D12 |
| 19 | D10 |
| 20 | D8 |

TABLE IV-continued

Memory Card Primary Connector Pinout

| Connector Pin # | Signal Name |
| --- | --- |
| 21 | D6 |
| 22 | D4 |
| 23 | D2 |
| 24 | D0 |
| 25 | VCC |
| 26 | VCC |
| 27 | GND |
| 28 | GND |
| 29 | TCOUT |
| 30 | TCCLK |
| 31 | nBLWE |
| 32 | nCAS |
| 33 | nCOLEN |
| 34 | GND(nA23L) |
| 35 | nA21L |
| 36 | nA19L |
| 37 | MA7 |
| 38 | MA5 |
| 39 | MA3 |
| 40 | MA1 |
| 41 | D15 |
| 42 | D13 |
| 43 | D11 |
| 44 | D9 |
| 45 | D7 |
| 46 | D5 |
| 47 | D3 |
| 48 | D1 |

TABLE V

Memory Card Secondary Pinout

| Connector Pin # | Signal Name |
| --- | --- |
| 1 | +5V |
| 2 | +5V |
| 3 | GND |
| 4 | GND |
| 5 | nMCRST |
| 6 | NCIN |
| 7 | nRRD |
| 8 | nBUWE |
| 9 | nBRAS |
| 10 | GND(nA22L) |
| 11 | nA20L |
| 12 | MA8 |
| 13 | MA6 |
| 14 | MA4 |
| 15 | MA2 |
| 16 | MA0 |
| 17 | D14 |
| 18 | D12 |
| 19 | D10 |
| 20 | D8 |
| 21 | D6 |
| 22 | D4 |
| 23 | D2 |
| 24 | D0 |
| 25 | VCC |
| 26 | VCC |
| 27 | GND |
| 28 | GND |
| 29 | NCOUT |
| 30 | NCCLK |
| 31 | nBLWE |
| 32 | nCAS |
| 33 | nCOLEN |
| 34 | GND(nA23L) |
| 35 | nA21L |
| 36 | nA19L |
| 37 | MA7 |
| 38 | MA5 |
| 39 | MA3 |
| 40 | MA1 |
| 41 | D15 |
| 42 | D13 |
| 43 | D11 |
| 44 | D9 |
| 45 | D7 |
| 46 | D5 |
| 47 | D3 |
| 48 | D1 |

TABLE VI

Memory Connector Signal Description

| Signal | Description |
| --- | --- |
| MA[8:0] | Multiplexed processor address lines of A[18:1] |
| D[15:0] | Bidirectional memory data bus. |
| nA[23:19]L | Upper non-multiplexed block address lines. |
| nRRD | Read signal which is used to control the output enable signal on the DRAMs. This signal is essential for controlling the data bus direction direction read-modify-write cycles. |
| nBRAS | This signal provides the DRAM row address strobe. |
| nCAS | This signal provides the DRAM Column address strobe. |
| nCOLEN | Column enable signal which is used to multiplex individual address lines for use by the DRAMs. nCOLEN is high when the row address is selected and low when the column address is selected. |
| nBLWE,nBUWE | Byte-oriented write enable signals. |
| nMCLRST | This signal is driven by the formatter and will reset all memory devices in the MCL chain. |
| TCIN | This is the primary MCL input for a memory device. It is driven by the MCL output of the previous memory device (NCOUT) or formatter (MCOUT). |
| TCOUT | This is the primary MCL output for a memory device. It drives the MCL input of the previous memory device (NCIN) or formatter (MCIN). |
| TCCLK | This is the primary MCL clock input for a memory device. It is driven by the previous memory device (NCCLK) or formatter (MCCLK). |
| NCOUT | This is the secondary MCL output for a memory device. It drives the MCL input of the next memory device (TCIN). |
| NCIN | This is the secondary MCL input for a memory device. It is driven by the MCL output of the next memory device (TCOUT). |
| NCCLK | This is the MCL clock driven of a memory device. It drives the MCL clock input (TCCLK) of the next memory device. |

MK3-0—MasK 3-0: these signals provide an address mapping overlay, unique to each memory module, so that each memory module enables memory when the system block address equals the address mask overlay.

MS2-0—Memory Size 2-0: these signals provide memory size status to the MCL Controller. The three signals provide eight possible memory block sizes, to be interrogated by the MCL Controller. Each value defines a block of memory and a block of memory is defined as 1 megabyte of memory.

MT1-0: Memory Type 1-0: these two signals indicate a type designation of a particular memory Device. These are four possible types that can be interrogated by the MCL Controller.

MDD—Memory Device Disable: this signal is used to disable or enable the DRAM memory on the expansion memory board. Memory is disabled when this signal is at a logic 1 level.

/RESET—/RESET is a low true hardware reset signal to the MCL processor. The MCL system must wait at least 1 millisecond after removing /RESET before initiating any MCL communication activity.

/TRACE—/TRACE is pulsed true after /RESET to indicate the MCL controller is functioning.

| | |
| --- | --- |
| VCC | +5V power supply for DRAMs. These lines provide 5V ± 5% to the memory devices. |

TABLE VI-continued

| Memory Connector Signal Description | |
|---|---|
| GND | Power supply return and logic reference. |

While the present invention has been particularly shown and described with respect to certain preferred embodiments thereof, it should be readily apparent to those of ordinary skill in the art that various changes and modifications in form and details may be made without departing from the spirit and scope of the invention as set forth in the appended claims.

What is claimed is:

1. In an expandable memory system for use in a computer system comprising a system controller and at least one memory module, each memory module including a module controller associated therewith, the first said module controller coupled to said system controller, and in series with additional module controllers forming a serial network with said system controller, a method for configuring the memory system comprising the steps of:
    sending an interface clear command from said system controller serially to said first module controller in said serial network;
    sending a configuration command having an encoded first address from said system controller to said first module controller, said first address being assigned to said first module controller;
    responding to said address assignment by said first module controller incrementing said address modifying said configuration command and sending said modified configuration command with said incremented address from said first module controller to said system controller;
    sending a memory size interrogate command from said system controller to said first module controller;
    responding to said interrogate command by sending an encoded memory size signal from said first module controller to said system controller, said encoded memory size signal representative of the memory capacity of said first memory module associated with said first module controller;
    formulating and sending a base address command having an encoded first base address from said system controller to said first module controller, said first base address assigned to a first memory module associated with said first module controller from said system controller;
    sending a pass-through command to said first module controller setting said first module controller to a pass through mode; and
    thereafter sending an interface clear command to said first module controller for pass through to any subsequent module controller coupled to said first module controller.

2. In an expandable memory system for use in a computer system comprising a system controller and at least one memory module, each memory module having a module controller associated therewith, the module controllers coupled serially forming a serial network with said system controller, a method for configuring the memory system comprising the steps of:
    sending an interface clear command from said system controller serially to a first module controller in said memory system;
    sending a configuration command having an encoded first address from said system controller to a first module controller, said first address being assigned to said first module controller;
    incrementing said address by said first module controller modifying said configuration command and sending said modified configuration command with said incremented address from said first module controller to said system controller;
    sending a memory size interrogate command from said system controller to said first module controller;
    sending an encoded memory size signal from said first module to said system controller, said encoded memory size signal representation of the memory capacity of said first memory module associated with said first module controller;
    sending a base address command having an encoded first base from said system controller to said first module controller, said first base address assigned to a first memory module associated with said first module controller; and
    sending a pass through command from said system controller to said first module controller setting said first module controller to a pass through mode, said pass through mode for coupling additional memory modules sequentially to said at least one memory module in series, and thereby forming a serial network with said system controller, and
    sending a read program code signal from said system controller to said first memory module for reading a selected portion of program code stored in said first module controller.

3. The method of claim 2 wherein the step of reading said selected portion of program code comprises:
    transmitting said selected portion of program code from said first module controller to said system controller; and
    comparing on a byte-by-byte basis said selected portion of program code to a corresponding program code stored in said system controller.

* * * * *